United States Patent
Chen (10) Patent No.: US 8,422,700 B2
(45) Date of Patent: Apr. 16, 2013

(54) AUDIO SIGNAL ADJUSTING SYSTEM AND METHOD

(75) Inventor: Chia-Ming Chen, Wugu (TW)

(73) Assignee: Hannstar Display Corporation, Wugu, Taipei County (TW)

( * ) Notice: Subject to any disclaimer, the term of this patent is extended or adjusted under 35 U.S.C. 154(b) by 295 days.

(21) Appl. No.: 12/916,403

(22) Filed: Oct. 29, 2010

(65) Prior Publication Data

US 2011/0299705 A1 Dec. 8, 2011

(30) Foreign Application Priority Data

Jun. 7, 2010 (TW) .............................. 99118452 A (51) Int. Cl.
*H03G 3/00* (2006.01)
*H03G 3/20* (2006.01)
*H04R 29/00* (2006.01)

(52) U.S. Cl.
USPC .............. 381/107; 381/56; 381/57; 381/104; 381/108; 381/109

(58) Field of Classification Search ................... 381/56, 381/57, 100–110
See application file for complete search history.

(56) References Cited

U.S. PATENT DOCUMENTS

| 5,666,426 A * | 9/1997 | Helms .............................. 381/57 |
| 6,868,162 B1 * | 3/2005 | Jubien et al. .................. 381/107 |
| 2007/0253578 A1 * | 11/2007 | Verdecanna et al. .......... 381/104 |
| 2008/0085007 A1 * | 4/2008 | Engelbrecht et al. ........... 381/57 |

* cited by examiner

*Primary Examiner* — Nhan T Tran
*Assistant Examiner* — Xi Wang
(74) *Attorney, Agent, or Firm* — Cheng-Ju Chiang (57) ABSTRACT

An audio signal adjusting method is disclosed, which comprises steps of: determining an environment noise level; calculating a ratio between an environment noise level and an output audio signal level to form a measuring value; comparing the measuring value with a predetermined threshold as an audio comfort value; and determining whether or not to adjust an audio signal parameter according to the comparison result. If the comparison result is incorrect, then the audio signal parameter is adjusted, and the output audio signal should be outputted according to the adjusted audio signal parameter. The audio signal adjusting method can satisfy the different user needs on different environment types.

14 Claims, 5 Drawing Sheets

AUDIO SIGNAL ADJUSTING SYSTEM AND METHOD

TECHNICAL FIELD OF THE INVENTION

The present invention relates to an audio signal adjusting system and method, and more particularly, to an audio signal adjusting system and method capable of actively adjusting an audio output intensity.

BACKGROUND OF THE INVENTION

Nowadays, common media playing devices such as televisions (TVs) and flat displays have become essential entertainment devices for the modern humans. Those media playing devices combining both functions of TVs and flat displays can not only provide a television channels for watching but also can be served as computer monitors. Within the tendency of developing various kinds of display components and image processing technologies, some of the media playing devices are capable of approaching the real image and sound without distortion. However, whether the audio volume intensity is at an appropriate level is significantly factored in a user's audio-visual feelings.

An external environment noise may affect that a user is forced to frequently adjust an audio volume of a media playing device. For instance, when the environment noise is made at a high level, the user has to manually increase the audio volume to hear clearer, whereas the user has to manually decrease the audio volume again as long as the environment noise is turned down. The intensity of audio volume output must be varied with satisfying the demand of the user's audio comfort. Under a manner that the environmental noise is varied frequently, the user has to manually adjust the audio volume over and over again. This would invoke inconvenient to watch television. For now, there are various multimedia systems introduced for automatically adjusting the audio volume based on the environmental noise variances. However, those conventional systems can not adjust the audio volume according to either the user's habit or different noise environment types, and thereby can not obtain an efficient audio volume adjustment and can not satisfy the needs on the user's audio comfort. Or else, those systems are too complicated to be convenient for the operation and to lower the manufacturing cost.

SUMMARY OF THE INVENTION

To solve the drawbacks of the aforementioned prior art, a primary objective of the present invention is to provide an audio signal adjusting system and method applicable for a media playing device, which is capable of automatically and dynamically adjusting an audio output intensity of the media playing device.

Another objective of the present invention is to provide an audio signal adjusting system and method applicable for a media playing device, which is capable of adjusting the audio volume according to either a user's habit or the environmental noise, and thereby satisfying the different user demands on different noise environment types.

To accomplish the above invention objectives, the present invention provides an audio signal adjusting method, which is applicable to an electronic device for receiving at least one input audio signal. Said audio signal adjusting method comprises the following steps of:

utilizing an audio signal detector for detecting an external acoustic signal outside the electronic device and transmitting the detected external acoustic signal to an audio processor;

utilizing the audio processor for generating an output audio signal according to an audio signal adjusting parameter and the at least one input audio signal, wherein the output audio signal has an output audio signal level, and the audio processor transmits the output audio signal level and the external acoustic signal to a microprocessor;

utilizing the microprocessor to control an evaluating and comparing logic unit to determine an environmental noise level according to the external acoustic signal, and thereby the microprocessor transmitting the environmental noise level back to the audio processor;

utilizing the audio processor for calculating a ratio between the environmental noise level and the output audio signal level to correspondingly form a measuring value;

utilizing the microprocessor for comparing the measuring value with a predetermined threshold; and utilizing the microprocessor for determining whether or not to adjust the audio signal adjusting parameter according to the comparison result of the measuring value and the predetermined threshold, wherein if the comparison result is incorrect, the microprocessor adjusts the audio signal adjusting parameter and then transmits the adjusted audio signal adjusting parameter to the audio processor, and the audio processor generates a corresponding output audio signal according to the adjusted audio signal adjusting parameter and the at least one input audio signal.

In another aspect, the present invention provides an audio signal adjusting system, which is applicable to an electronic device for receiving an input audio signal. Said audio signal adjusting system comprises:

an audio signal detector for detecting an external acoustic signal outside the electronic device;

an audio processor for generating an output audio signal according to an audio signal adjusting parameter and the input audio signal, wherein the output audio signal has an output audio signal level;

an evaluating and comparing logic unit for determining an environmental noise level according to the external acoustic signal, wherein the audio processor calculates a ratio between the environmental noise level and the output audio signal level and thereby correspondingly forming a measuring value;

a memory for storing a predetermined threshold; and a microprocessor connected to the memory and the audio processor for respectively receiving the measuring value from the audio processor and the predetermined threshold from the memory, and comparing the measuring value with the predetermined threshold.

In the present invention, the audio signal adjusting parameter (e.g., a volume setting value) is automatically and dynamically adjusted according to the ratio between the environmental noise level and the output audio signal level for the situation that the user feels comfortable, endurable, or adequate. Therefore, the present invention is capable of solving the drawbacks of frequently adjusting the volume by hand in a noisy place. Moreover, the comfort ratio between the environmental noise level and the output audio signal level is decided by the user or selected from the predetermined values stored in the system. Therefore, the present invention is capable of adjusting the volume according to a user's habit and thereby satisfying the different user demands on different noise environment types.

BRIEF DESCRIPTION OF THE DRAWINGS

The present invention will be described in details in conjunction with the appending drawings.

DETAILED DESCRIPTION OF THE INVENTION

Figure 1A:
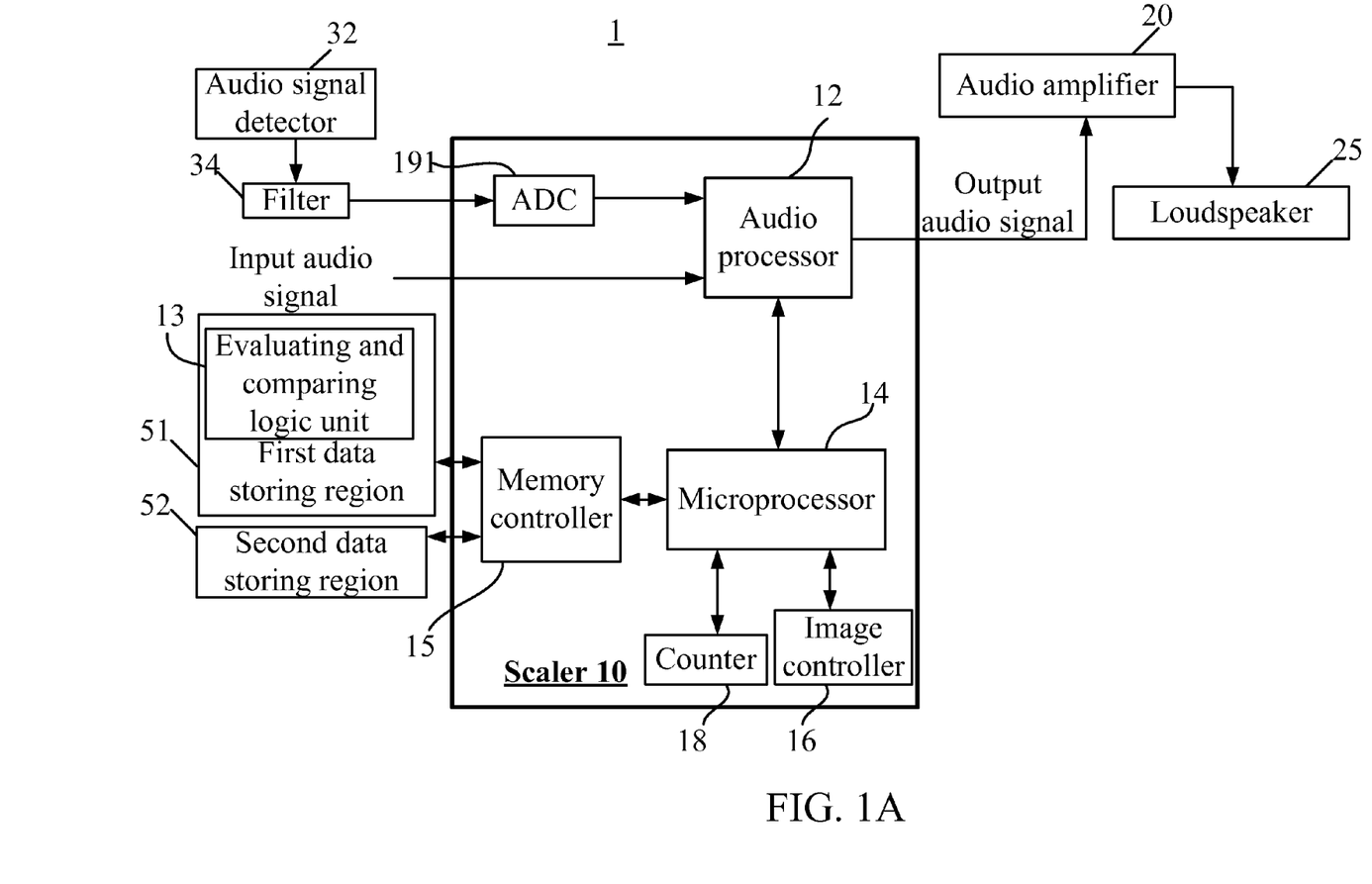
FIG. 1A is a structural diagram showing an audio signal adjusting system implemented according to a first embodiment of the present invention.

Please refer to FIG. 1A, which is a structural diagram showing an audio signal adjusting system 1 implemented according to a first embodiment of the present invention. The audio signal adjusting system 1 is applied to a media playing device. In the first embodiment, the media playing device may be a type of video systems such as televisions (TVs), and displays, etc. These video systems all have a scaler 10 for adjusting image size, resolution, and processing audio signals. FIG. 1A only shows those components relating to audio signal processing. It is noted that the audio signal adjusting system 1 of the present invention is not limited to be applied to multimedia systems (e.g., televisions and displays). The system 1 is also applicable to any kind of media playing devices.

As shown in FIG. 1A, the audio signal adjusting system 1 of the first embodiment comprises an audio processor 12, an evaluating and comparing logic unit 13, a microprocessor 14, a memory controller 15, an image controller 16, a counter 18, an analog-to-digital converter (ADC) 191, a first data storing region 51, a second data storing region 52, an audio amplifier 20, a loudspeaker 25, an audio signal detector 32, and a filter 34. The audio amplifier 20 and the loudspeaker 25 can be components existed in or excluded from the media playing device.

In the first embodiment shown in FIG. 1A, a part of components in the audio signal adjusting system 1, such as the audio processor 12, the evaluating and comparing logic unit 13, the microprocessor 14, the memory controller 15, the image controller 16, the counter 18, the ADC 191, the first data storing region 51, and the second data storing region 52, are connected to or included within the scaler 10 of the media playing device. The image controller 16 (e.g., on screen display (OSD) controller) is a component existed in the media playing device, and can be connected to the microprocessor 14. In other embodiments, a part of or all the components in the audio signal adjusting system 1 can be arranged in other electronic portions of the media playing device instead of the scaler 10.

The audio signal detector 32 is utilized for detecting an external acoustic signal outside the media playing device. The external acoustic signal consists of an environmental noise and the sound released from the loudspeaker 25 (e.g., the sound from a television). Then, the detected external acoustic signal is filtered by the filter 34 and then transmitted to the audio processor 12 of the scaler 10.

At the time the media playing device receives an input audio signal, the scaler 10 functions on processing the input audio signal and correspondingly outputting an output audio signal (detailed later). After the output audio signal is amplified by the audio amplifier 20 into an amplified electronic signal, the amplified electronic signal is further converted by the loudspeaker 25 into a physical acoustic wave which is audible for the user. The aforesaid input audio signal can be an analog signal or a digital signal, and can be inputted from various kinds of different interfaces, or an audio source signal oriented from a cable television or a wireless television. The aforesaid output audio signal also can be outputted for other devices via different interfaces, besides the loudspeaker 25.

At the time the scaler 10 processes the input audio signal, the audio processor 12 receives the input audio signal and then modulates the input audio signal according to an audio signal adjusting parameter, and thereby correspondingly generates the output audio signal. The audio signal adjusting parameter can be a volume setting value of television. The audio signal adjusting parameter may be pre-stored in the first data storing region 51 such as a flash memory or in the second data storing region 52 such as a DDR memory (double data rate synchronous dynamic random access memory). The audio signal adjusting parameter is adjusted by calculation and determination (described later). The microprocessor 14 determines to read out the audio signal adjusting parameter pre-stored in the first data storing region or the second data storing region through the memory controller 15. The microprocessor 14 also transmits the audio signal adjusting parameter to the audio processor 12 and then the audio processor 12 modulates the input audio signal according to the audio signal adjusting parameter and thereby correspondingly generates the output audio signal. Then, the output audio signal is transmitted to the audio amplifier 20 and the loudspeaker 25.

The audio processor 12 can generate an output audio signal level corresponding to the output audio signal. The microprocessor 14 is connected to the audio processor 12. The microprocessor 14 receives the output audio signal level and the external acoustic signal from the audio processor 12. In addition, the microprocessor 14 is coupled to the image controller 16 and the counter 18. The image controller 16 is utilized for controlling information display on a screen and a command input therefrom. The counter 18 is utilized for counting and thereby transmitting the counting results to the microprocessor 14. In addition, the ADC 191 is utilized for sampling an audio signal and then converting the sampled audio signal from analog to digital.

In the present invention, the amplitude of the output audio signal is adjusted according to an environmental noise so as to change the sound volume outputted from the loudspeaker 25. For instance, the output volume is increased automatically when the environmental noise is made at a high level and the output volume is decreased automatically when the environmental noise is made at a low level. Therefore, a user does not need to manually adjust the output volume, repeatedly or frequently.

As shown in FIG. 1A, the audio signal detector 32, e.g., a microphone, is utilized for detecting the external acoustic signal outside the media playing device. The audio signal detected by the audio signal detector 32 is transmitted to the filter 34 so as to be filtered out those audio frequencies inaccessible to the human ear, and then the filtered signal is transmitted to the ADC 191 to be sampled.

If the input audio signal is an analog signal, it is required to be sampled by the ADC 191. The input audio signal can be represented as:

$$A\text{in} = \alpha \times A_{sample}, \qquad \text{(equation 1)}$$

wherein Ain is the input audio signal, $\alpha$ is a sampling variation coefficient of the ADC 191, and $A_{sample}$ is a sampled audio signal.

The external acoustic signal detected by the audio signal detector 32 may include an environmental noise and the sound outputted from the loudspeaker 25, as represented as:

$$Min = \alpha \times \{f \otimes \lfloor \gamma \times \beta \times G \times A_{sample} + \gamma \times N_{environment} \rfloor\}, \quad \text{(equation 2)}$$

wherein Min is the external acoustic signal detected by the audio signal detector 32, β corresponds to the characteristic curves of the audio amplifier 20 and the loudspeaker 25, γ is a detecting variation coefficient of the audio signal detector 32, α is the sampling variation coefficient of the ADC 191 as mentioned above, f corresponds to a transfer function of the filter 34, G is the audio signal adjusting parameter, and $N_{environment}$ is an environmental noise level.

Assuming that the passband of the filter 34 is at all frequencies and thus the transfer function is identical to 1, the environmental noise level ($N_{environment}$) can be obtained from the equation 1 and the equation 2, as represented as:

$$N_{environment} = \frac{Min - \beta \times \gamma \times G \times Ain}{\alpha \times \gamma}. \quad \text{(equation 3)}$$

Figure 1B:
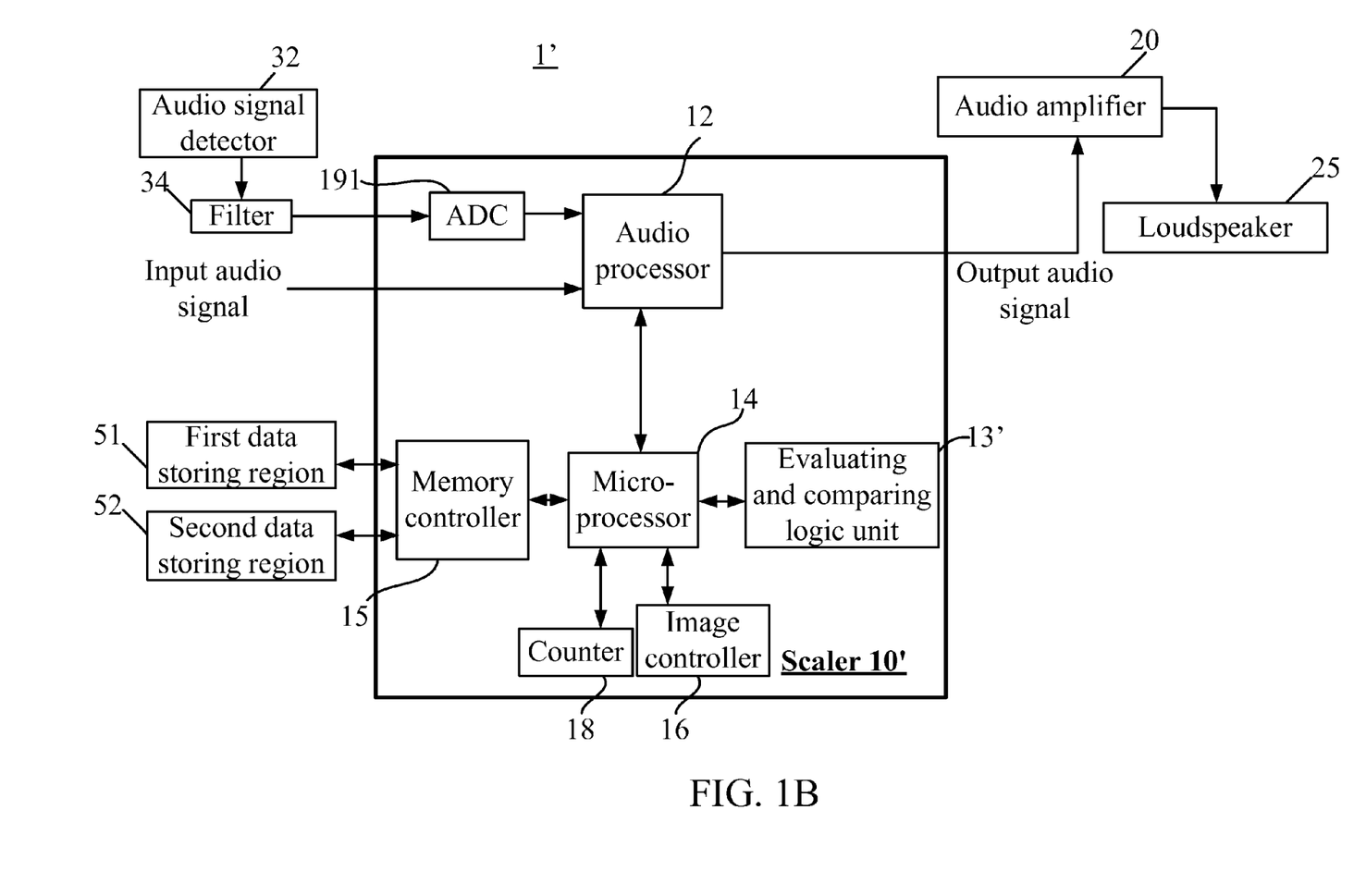
FIG. 1B is a structural diagram showing that an evaluating and comparing logic unit is implemented as a hardware in another implementation of the first embodiment.

The calculation of equation 3 is carried out by the evaluating and comparing logic unit 13 under control of the microprocessor 14. The evaluating and comparing logic unit 13 can be implemented as a program pre-stored in the first data storing region 51 as shown in FIG. 1A, or a hardware as shown in FIG. 1B. In FIG. 1B, the evaluating and comparing logic unit 13' is a hardware arranged in the scaler 10' of the audio signal adjusting system 1'. As shown in FIGS. 1A and 1B, the evaluating and comparing logic unit 13, 13' can access those default parameters pre-stored in the first data storing region 51, e.g., the audio signal adjusting parameter (G), the detecting variation coefficient of the audio signal detector 32 (γ) the sampling variation coefficient of the ADC 191 (α), the characteristic curves of the audio amplifier 20 and the loudspeaker 25 (β), for calculating the environmental noise level ($N_{environment}$). It is noted that the environmental noise level ($N_{environment}$) is not limited to be obtained through the above mentioned equation 3. In the present invention, any other manner to obtain the environmental noise level ($N_{environment}$) can be implemented as well.

$A_{sample}$ can be a root-mean-square value of voltage or power obtained from continuously sampling the input audio signal (Ain) for a time period, e.g., one second. The output audio signal level and the environmental noise level ($N_{environment}$) also can be a root-mean-square value of voltage or power.

The evaluating and comparing logic unit 13, 13' is controlled by the microprocessor 14. The evaluating and comparing logic unit 13, 13' receives the external acoustic signal (Min) and the input audio signal (Ain) from the microprocessor 14. Then, the evaluating and comparing logic unit 13, 13' performs a calculation to obtain the environmental noise level ($N_{environment}$) according to the external acoustic signal (Min), the input audio signal (Ain), and those parameters pre-stored in the data storing region 51 or 52, e.g., the audio signal adjusting parameter (G), the detecting variation coefficient of the audio signal detector 32 (γ) the sampling variation coefficient of the ADC 191 (α), the characteristic curves of the audio amplifier 20 and the loudspeaker 25 (β). The obtained environmental noise level ($N_{environment}$) is transmitted to the audio processor 12 via the microprocessor 14. The audio processor 12 calculates a ratio between the environmental noise level ($N_{environment}$) and the output audio signal level for correspondingly forming a measuring value and then transmits the measuring value to the microprocessor 14. The microprocessor 14 compares the measuring value with a predetermined threshold for determining whether or not to adjust the audio signal adjusting parameter. If the comparing result is incorrect, the microprocessor 14 adjusts the audio signal adjusting parameter and transmits the adjusted audio signal adjusting parameter to the audio processor 12. Then, the audio processor 12 generates a corresponding output audio signal according to the adjusted audio signal adjusting parameter and the input audio signal. The predetermined threshold may have an upper limit and a lower limit, and the microprocessor 14 may compare the measuring value respectively with the upper limit and the lower limit.

In an example that the comparing result is incorrect when the microprocessor 14 determines that the measuring value has exceeded a range of the predetermined threshold that is constructed by the upper limit and the lower limit, the microprocessor 14 adjusts the audio signal adjusting parameter and then the audio processor 12 generates a corresponding output audio signal according to the adjusted audio signal adjusting parameter and the input audio signal. In another case, the comparing result is incorrect when the microprocessor 14 determines that the measuring value is greater than the upper limit of the predetermined threshold or is smaller than the lower limit of the predetermined threshold for a predetermined number of times, the microprocessor 14 adjusts the audio signal adjusting parameter and then the audio processor 12 generates a corresponding output audio signal according to the adjusted audio signal adjusting parameter and the input audio signal. Or else, the comparing result is correct when the microprocessor 14 determines that the measuring value does not exceed the range of the predetermined threshold constructed by the upper limit and the lower limit, the microprocessor 14 determines not to adjust the audio signal adjusting parameter, whereby the audio processor 12 generates the output audio signal according to the original audio signal adjusting parameter and the input audio signal.

Figure 2:
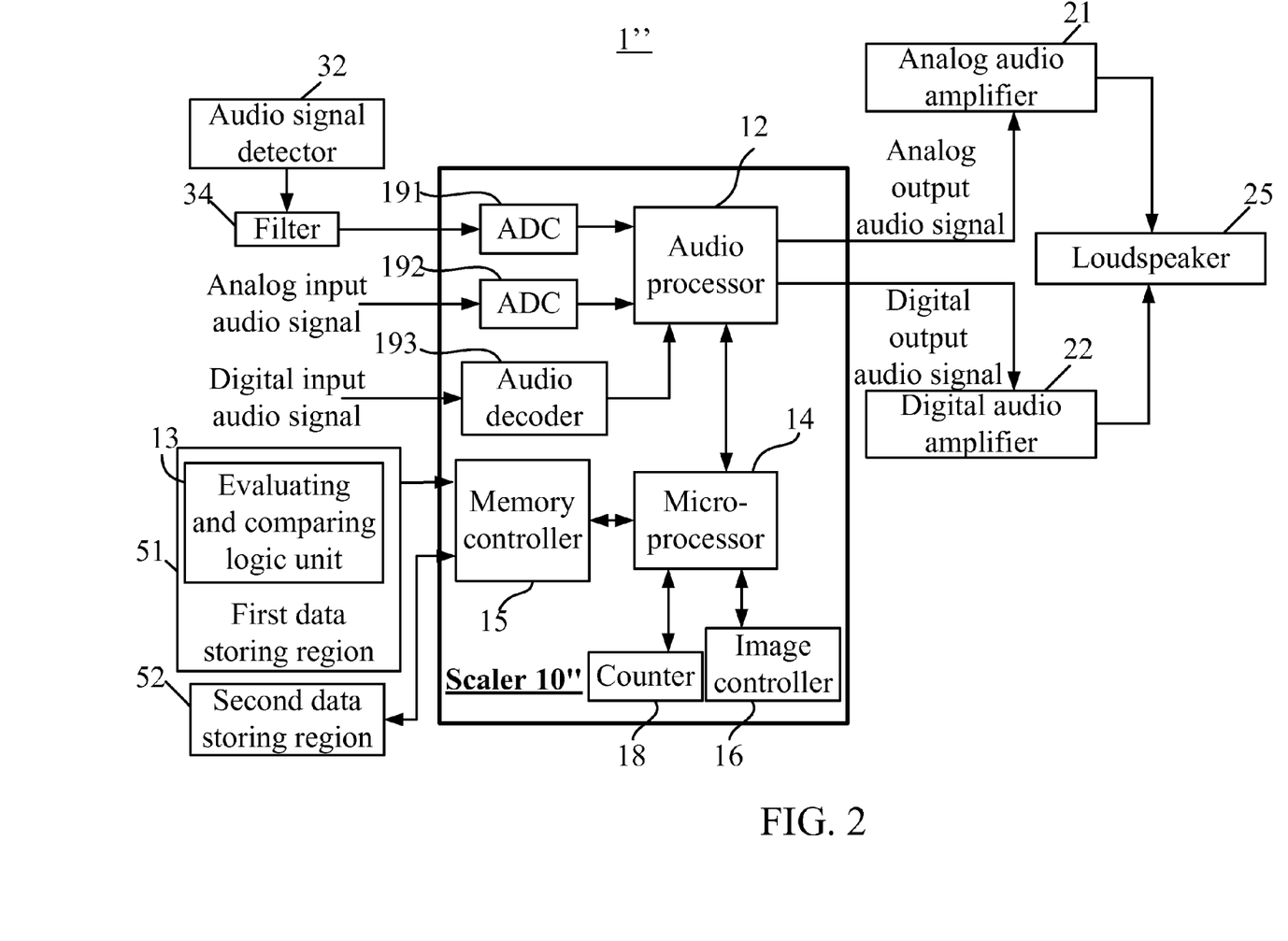
FIG. 2 is a structural diagram showing an audio signal adjusting system implemented according to a second embodiment of the present invention.

Please refer to FIG. 2, which is a structural diagram showing an audio signal adjusting system 1'' implemented according to a second embodiment of the present invention. The difference between the first embodiment and the second embodiment is that the scaler 10'' can be inputted with an analog input audio signal and/or a digital input audio signal and the audio processor 12 can output an analog output audio signal and/or a digital output audio signal in the second embodiment of the present invention. The analog input audio signal may come from interfaces or standards such as ATV, DTV, AV, YPbPr, HDMI, PC-line-in for a television. The analog input audio signal is converted to a digital signal by an analog-to-digital converter (ADC) 192 and then the digital signal is transmitted to the audio processor 12. Since the digital input audio signal is compressed inherently, the digital input audio signal has to be decoded by an audio decoder 193 in advance. Then, the decoded input audio signal is transmitted to the audio processor 12. In the second embodiment, the audio processor 12 can output an analog output audio signal and/or a digital output audio signal. The analog output audio signal and the digital output audio signal are amplified respectively through an analog audio amplifier and a digital audio amplifier, and then transmitted to the loudspeaker 25. Since the other components in this embodiment are similar to those of the first embodiment, the detailed descriptions regarding these components are omitted herein.

Figure 3:
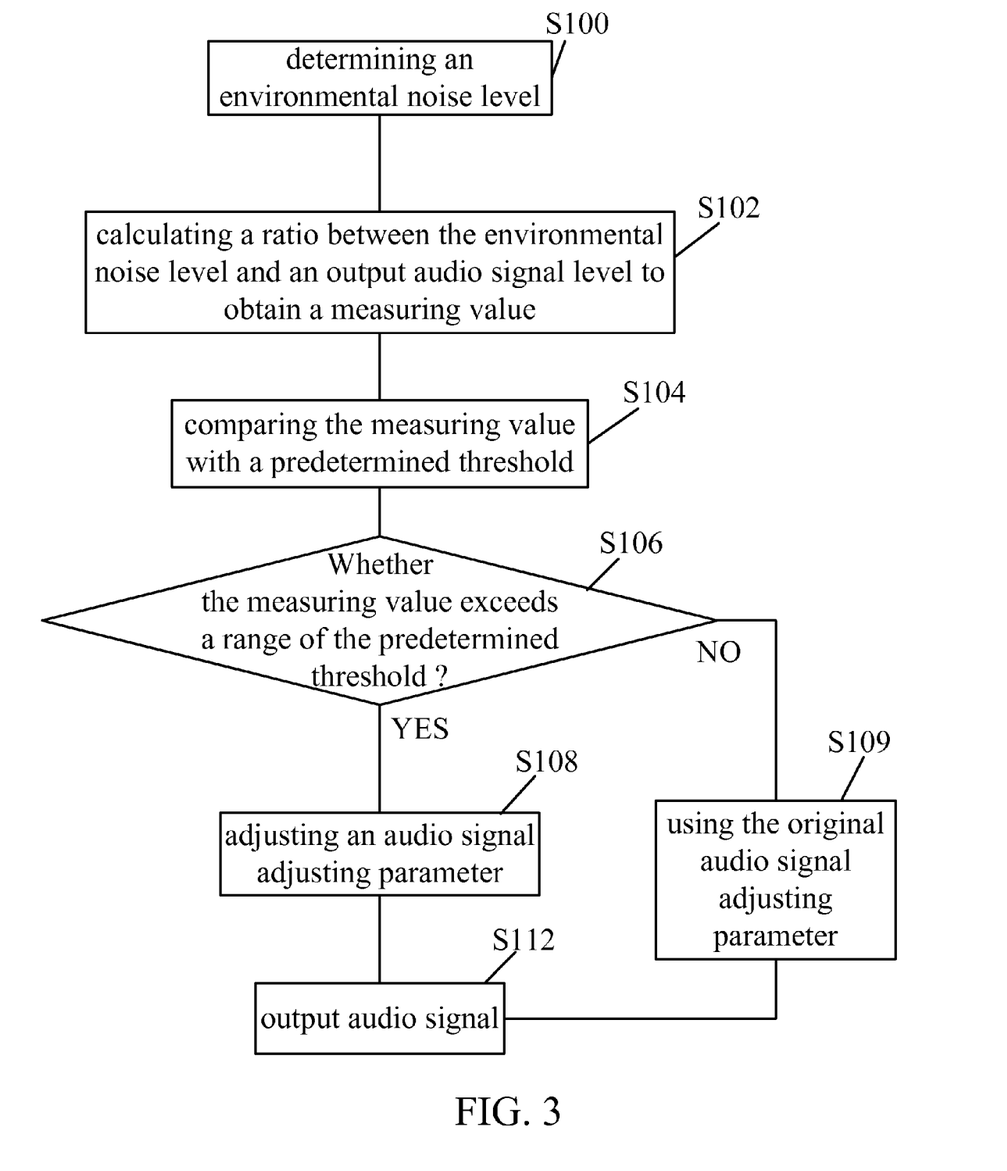
FIG. 3 is a flow chart showing an audio signal adjusting method implemented according to the present invention.

Please refer to FIGS. 1A and 3. FIG. 3 is a flow chart showing an audio signal adjusting method implemented according to the present invention, which is applicable for a media playing device. In the application of the present invention, the media playing device is capable of receiving an input audio signal and automatically determining whether or not to adjust the audio output according to an environmental noise.

In the beginning, an audio signal detector 32 is utilized for detecting an external acoustic signal outside the electronic device and transmitting the detected external acoustic signal to an audio processor 12.

The audio processor 12 is utilized for correspondingly generating an output audio signal according to an audio signal adjusting parameter and the input audio signal. The output audio signal has an output audio signal level. The audio processor 12 transmits the output audio signal level and the external acoustic signal to a microprocessor 14.

In Step S100, the microprocessor 14 controls an evaluating and comparing logic unit 13 to determine an environmental noise level. For instance, the microprocessor 14 controls the evaluating and comparing logic unit 13 to perform the calculation of afore-mentioned equation 3 to obtain the environmental noise level. The environmental noise level can be an instant value or an average value with respect to a sampling period. In one embodiment, the evaluating and comparing logic unit 13 can be implemented as a program pre-stored in a first data storing region 51. This program is capable of performing the calculation of aforesaid equation 3. The microprocessor 14 can access the program pre-stored in the first data storing region 51 through a memory controller 15 and control the evaluating and comparing logic unit 13 to execute the program. The calculation results can be temporarily stored in a second data storing region 52. In another embodiment, the evaluating and comparing logic unit 13 can be implemented as a hardware which is capable of performing the calculation of aforesaid equation 3.

In Step S102, the audio processor 12 receives the environmental noise level from the evaluating and comparing logic unit 13 via the microprocessor 14. The audio processor 12 calculates a ratio between the environmental noise level and the output audio signal level for correspondingly forming a measuring value. The measuring value is defined as a measuring audio environment noise ratio (MAENR). This measuring value can be stored in the second data storing region 52.

In Step S104, the microprocessor 14 and the audio processor 12 are connected and the microprocessor 14 receives the measuring value from the audio processor 12. The microprocessor 14 compares the measuring value with a predetermined threshold. The predetermined threshold is an audio comfort value with which a user feels comfortable. The audio comfort value is defined as a threshold audio environment noise ratio (TAENR). TAENR is a ratio between the environmental noise level and the output audio signal level for the situation with which the user feels comfortable, or endurable. For instance, in a particular environment, the user adjusts an original volume to a comfortable volume by hand. After the comfortable volume is set up, the microprocessor 14 calculates the TAENR according to the comfortable volume set by the user and the environmental noise level at the time. As described above, this predetermined threshold can be set or decided by the user. In another case, the predetermined threshold is pre-stored in the system. The system can be designed to include several different modes corresponding to different predetermined thresholds. The predetermined thresholds of different values can be pre-stored in the first data storing region 51. The user can select one of the audio comfort values (i.e., the predetermined thresholds) pre-stored in the first data storing region 51, by manipulating or transmitting a command to an image controller 16 via an input interface. Then, the audio comfort value selected by the user is transmitted to the microprocessor 14.

In Step S106, the microprocessor 14 determines whether or not to adjust the audio signal adjusting parameter (e.g., whether or not to adjust the output volume) according to whether the comparing result between the MAENR and the TAENR is correct or not. The audio processor 12 modulates the input audio signal and correspondingly generates the output audio signal according to the audio signal adjusting parameter from the microprocessor 14.

The comparing result is incorrect when the microprocessor 14 determines that the MAENR is greater than the TAENR or the MAENR exceeds a range defined according to the TAENR, the microprocessor 14 adjusts the audio signal adjusting parameter (Step S108) and then transmits the adjusted audio signal adjusting parameter to the audio processor 12. That is, the amplitude of the output audio signal will be adjusted. Then, the audio processor 12 generates a corresponding output audio signal according to the adjusted audio signal adjusting parameter (Step S112). Conversely, the comparing result is correct when the microprocessor 14 determines that the MAENR is smaller than or equal to the TAENR, or the MAENR does not exceed the range defined according to the TAENR, the original audio signal adjusting parameter is maintained or unchanged (Step S109). That is, the audio signal adjusting parameter will not be adjusted. Then, the audio processor 12 generates the output audio signal according to the original audio signal adjusting parameter (Step S112).

When adjusting the audio signal adjusting parameter, the microprocessor 14 can increase or decrease the audio signal adjusting parameter by a small unit in one time. For instance, the microprocessor 14 can increase or decrease the volume little by little. The microprocessor 14 also can adjust the volume in one time to make the MAENR approaching the TAENR. In another manner, the audio signal adjusting parameter can be adjusted according to a conversion table or a conversion curve stored in the system. If the volume is already at a high level, the increasing amplitude or the decreasing amplitude can be cut down.

In the present invention, the audio signal adjusting parameter (e.g., a volume setting value) is automatically and dynamically adjusted according to the ratio between the environmental noise level and the output audio signal level for the situation that the user feels comfortable, or endurable. Therefore, the present invention is capable of solving the drawbacks of frequently adjusting the volume by hand in a noisy place. Moreover, the comfort ratio between the environmental noise level and the output audio signal level is decided by the user or selected from the predetermined values stored in the system. Therefore, the present invention is capable of adjusting the volume according to a user's habit and thereby satisfying the different user demands on different noise environment types.

Figure 4:
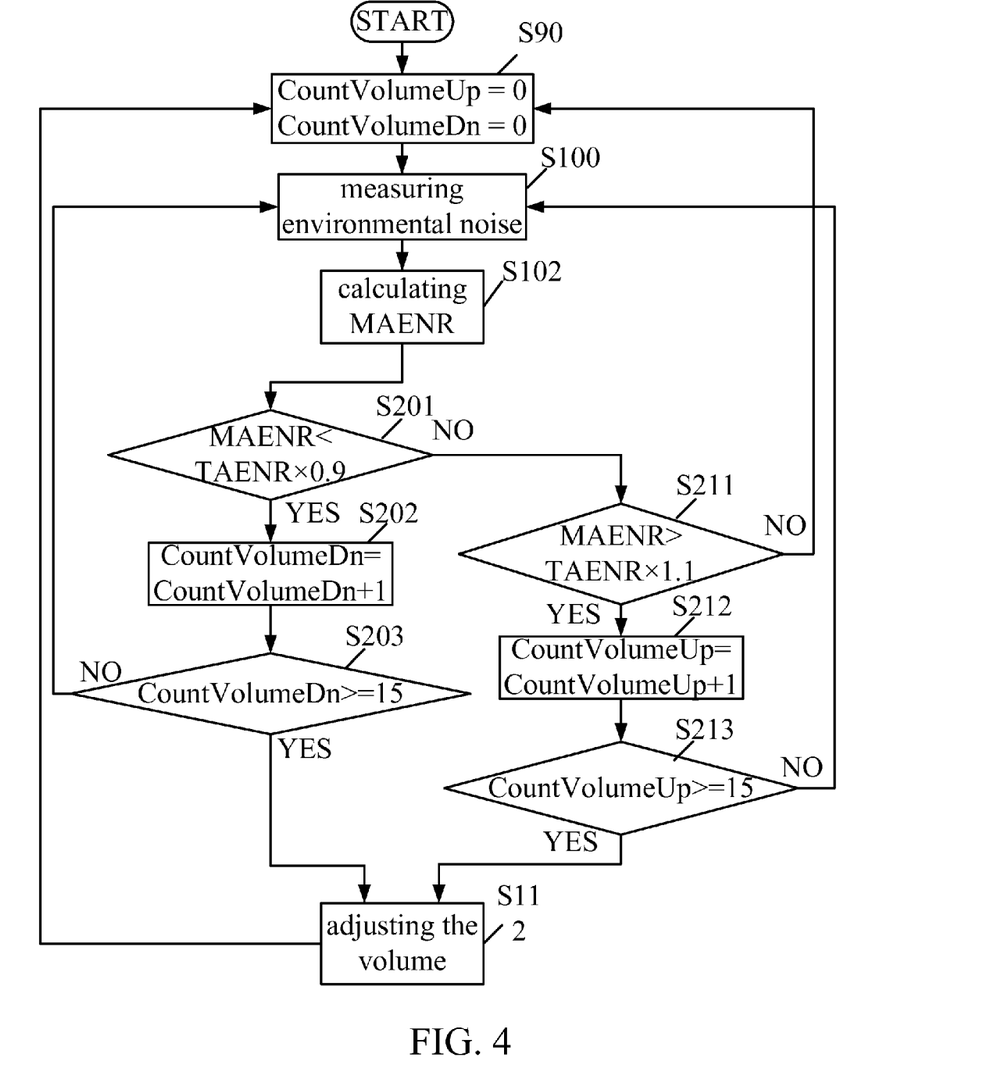
FIG. 4 is a flow chart showing Step S106 of FIG. 3 in detail for determining whether a measuring value exceeds a predetermined threshold.

Please refer to FIGS. 1A, 3, and 4. FIG. 4 is a flow chart showing the Step S106 of FIG. 3 in detail. The Step S106 is used to determine whether the comparing resulted is incorrect, e.g., whether the measuring value exceeds the range of the predetermined threshold.

In the beginning, the microprocessor 14 sets a zero value to the two parameters in a counter 18, i.e., CountVolumeUp and CountVolumeDown. These two parameters are utilized for counting a time when the condition is satisfied and accumulating the counts. After the external acoustic signal is detected, the environmental noise level is determined for calculating the MAENR. The microprocessor 14 further compares the MAENR respectively with TAENR×1.1 (i.e., the upper limit) and TAENR×0.9 (i.e., the lower limit) (as performed by Steps S201, S211). When the MAENR is found smaller than the lower limit of the TAENR, the counter 18 counts a time and the value of CountVolumeDown is increased by one (as Step S202). When the MAENR is found greater than the upper limit of the TAENR, the counter 18 counts a time and the value of CountVolumeUp is increased by one (as Step S212). When the value of either CountVolumeDown or CountVolumeUp reaches to a predetermined number of times (e.g., 15 times) (Step S203 or Step S213), the microprocessor 14 determines to adjust the audio signal adjusting parameter for correspondingly altering the audio output. For instance, the microprocessor adjusts a volume setting value for increasing or decreasing the volume. In the present invention, the MAENR is respectively compared with TAENR×1.1 (i.e., the upper limit) and TAENR×0.9 (i.e., the lower limit). Therefore, it can avoid adjusting the audio signal adjusting parameter over and over again, and thereby the power consumption is reduced. Moreover, the audio signal adjusting parameter is adjusted only when the value of CountVolumeDown or CountVolumeUp reaches to 15 times. Therefore, the adjusting process triggered by occasional or temporal noise interferences also can be avoided.

For instance, the microprocessor 14 increases the volume setting value to increase the audio output only when the environmental noise increases and MAENR>TAENR×1.1 and when the value of CountVolumeUp reaches to 15 times. Therefore, the user can hear the sound released from a loudspeaker 25 even though the environmental noise increases. Conversely, the microprocessor 14 decreases the volume setting value to decrease the audio output only when the environmental noise decreases and MAENR<TAENR×0.9 and when the value of CountVolumeDown reaches to 15 times. Therefore, the user still can hear the sound released from the loudspeaker 25 under the appropriate volume.

While the preferred embodiments of the present invention have been illustrated and described in detail, various modifications and alterations can be made by persons skilled in this art. The embodiment of the present invention is therefore described in an illustrative but not restrictive sense. It is intended that the present invention should not be limited to the particular forms as illustrated, and that all modifications and alterations which maintain the spirit and realm of the present invention are within the scope as defined in the appended claims.

What is claimed is:

1. An audio signal adjusting method applied for an electronic device receiving at least one input audio signal, and said audio signal adjusting method comprising steps of:

utilizing an audio signal detector for detecting an external acoustic signal outside the electronic device and transmitting the detected external acoustic signal to an audio processor;

utilizing the audio processor for generating an output audio signal according to an audio signal adjusting parameter and the at least one input audio signal, wherein the output audio signal has an output audio signal level, and the audio processor transmits the output audio signal level and the external acoustic signal to a microprocessor;

utilizing the microprocessor to control an evaluating and comparing logic unit to determine an environmental noise level according to the external acoustic signal, the at least one input audio signal, and the audio signal adjusting parameter, in which the evaluating and comparing logic unit accesses the audio signal adjusting parameter that is pre-stored in a data storing region, and thereby the microprocessor transmitting the environmental noise level back to the audio processor;

utilizing the audio processor for calculating a ratio between the environmental noise level and the output audio signal level to correspondingly form a measuring value;

utilizing the microprocessor for comparing the measuring value with a predetermined threshold; and utilizing the microprocessor for determining whether or not to adjust the audio signal adjusting parameter according to the comparison result of the measuring value and the predetermined threshold, wherein if the comparison result is incorrect, the microprocessor adjusts the audio signal adjusting parameter and then transmits the adjusted audio signal adjusting parameter to the audio processor, and the audio processor generates a corresponding output audio signal according to the adjusted audio signal adjusting parameter and the at least one input audio signal.

2. The audio signal adjusting method of claim 1, wherein the predetermined threshold is a predetermined ratio between the environmental noise level and the output audio signal level, which can be selected via an input interface.

3. The audio signal adjusting method of claim 1, wherein the comparison result is incorrect when the measuring value exceeds a range of the predetermined threshold constructed by an upper limit and a lower limit, so that the microprocessor adjusts the audio signal adjusting parameter.

4. The audio signal adjusting method of claim 3, wherein the comparison result is incorrect when the measuring value is greater than the upper limit of the predetermined threshold or is smaller than the lower limit of the predetermined threshold for a predetermined number of times, so that the microprocessor adjusts the audio signal adjusting parameter.

5. The audio signal adjusting method of claim 1, wherein the audio signal adjusting parameter comprises a volume setting value, and the output audio signal level is a root-mean-square (RMS) value of the output audio signal.

6. The audio signal adjusting method of claim 1, wherein in the step of utilizing the microprocessor to control the evaluating and comparing logic unit to determine the environmental noise level, the environmental noise level is determined further based on a detecting variation coefficient of the audio signal detector, and characteristic curves of an audio amplifier and a loudspeaker coupled to receive the output audio signal, in which the evaluating and comparing logic unit accesses the detecting variation coefficient of the audio signal detector and the characteristic curves of the audio amplifier and the loudspeaker that are pre-stored in the data storing region.

7. The audio signal adjusting method of claim 6, wherein in the step of utilizing the microprocessor to control the evaluating and comparing logic unit to determine the environmental noise level, the environmental noise level is determined according to following equation:

$$N_{environment} = \frac{\text{Min} - \beta \times \gamma \times G \times A_{in}}{\alpha \times \gamma},$$

where $N_{environment}$ is the environmental noise level, Min is the external acoustic signal detected by the audio signal detector, $A_{in}$ is the input audio signal, G is the audio signal adjusting parameter, $\alpha$ is a sampling variation coefficient of an analog-to-digital converter coupled to receive the input audio signal, $\beta$ corresponds to the characteristic curves of the audio amplifier and the loudspeaker coupled to receive the output audio signal, and γ is the detecting variation coefficient of the audio signal detector.

8. An audio signal adjusting system applied to an electronic device, the electronic device receiving an input audio signal, said audio signal adjusting system comprising:
an audio signal detector for detecting an external acoustic signal outside the electronic device;
an audio signal processor for generating an output audio signal according to an audio signal adjusting parameter and the input audio signal, wherein the output audio signal has an output audio signal level;
an evaluating and comparing logic unit for determining an environmental noise level according to the external acoustic signal, the at least one input audio signal, and the audio signal adjusting parameter, in which the evaluating and comparing logic unit accesses the audio signal adjusting parameter that is pre-stored in a data storing region, wherein the audio processor calculates a ratio between the environmental noise level and the output audio signal level and thereby correspondingly forms a measuring value;
a memory for storing a predetermined threshold; and
a microprocessor connected to the memory and the audio processor, receiving the measuring value from the audio processor and the predetermined threshold from the memory, and comparing the measuring value with the predetermined threshold.

9. The audio signal adjusting system of claim 8, wherein the predetermined threshold is a predetermined ratio between the environmental noise level and the output audio signal level, which can be selected via an input interface.

10. The audio signal adjusting system of claim 8, wherein when the measuring value exceeds a range of the predetermined threshold constructed by an upper limit and a lower limit, the audio signal adjusting parameter is adjusted.

11. The audio signal adjusting system of claim 10, wherein when the measuring value is greater than the upper limit of the predetermined threshold or is smaller than the lower limit of the predetermined threshold for a predetermined number of times, the audio signal adjusting parameter is adjusted.

12. The audio signal adjusting system of claim 8, wherein the audio signal adjusting parameter comprises a volume setting value, and the output audio signal level is a root-mean-square (RMS) value of the output audio signal.

13. The audio signal adjusting system of claim 8, wherein the environmental noise level is determined further based on a detecting variation coefficient of the audio signal detector, and characteristic curves of an audio amplifier and a loudspeaker coupled to receive the output audio signal, in which the evaluating and comparing logic unit accesses the detecting variation coefficient of the audio signal detector and the characteristic curves of the audio amplifier and the loudspeaker that are pre-stored in the data storing region.

14. The audio signal adjusting system of claim 13, wherein the environmental noise level is determined according to following equation:

$$N_{environment} = \frac{\text{Min} - \beta \times \gamma \times G \times Ain}{\alpha \times \gamma},$$

where $N_{environment}$ is the environmental noise level, Min is the external acoustic signal detected by the audio signal detector, Ain is the input audio signal, G is the audio signal adjusting parameter, α is a sampling variation coefficient of an analog-to-digital converter coupled to receive the input audio signal, β corresponds to the characteristic curves of the audio amplifier and the loudspeaker coupled to receive the output audio signal, and γ is the detecting variation coefficient of the audio signal detector.

* * * * *